(12) United States Patent
Zimmerman

(10) Patent No.: US 7,736,573 B2
(45) Date of Patent: Jun. 15, 2010

(54) THERMOPLASTIC MATERIAL

(75) Inventor: Michael Zimmerman, North Andover, MA (US)

(73) Assignee: Interplex QLP, Inc., College Point, NY (US)

(*) Notice: Subject to any disclaimer, the term of this patent is extended or adjusted under 35 U.S.C. 154(b) by 861 days.

(21) Appl. No.: 10/920,857

(22) Filed: Aug. 18, 2004

(65) Prior Publication Data

US 2005/0012080 A1    Jan. 20, 2005

Related U.S. Application Data

(62) Division of application No. 10/767,309, filed on Jan. 29, 2004, now Pat. No. 6,867,367.

(60) Provisional application No. 60/443,470, filed on Jan. 29, 2003.

(51) Int. Cl.
*B29C 45/00*    (2006.01)
(52) U.S. Cl. .................. 264/328.1; 264/328.18
(58) Field of Classification Search ....................... None
See application file for complete search history.

(56) References Cited

U.S. PATENT DOCUMENTS

| | | | | |
|---|---|---|---|---|
| 4,288,081 A | | 9/1981 | Sado | 174/35 |
| 4,343,376 A | * | 8/1982 | Tsukagoshi et al. | 181/167 |
| 4,880,591 A | * | 11/1989 | Baba | 264/327 |
| 5,151,149 A | * | 9/1992 | Swartz | 156/379.8 |
| 5,586,214 A | | 12/1996 | Eckman | |
| 5,691,689 A | | 11/1997 | Smith et al. | |
| 5,700,724 A | | 12/1997 | Shipe | 437/215 |
| 5,731,542 A | | 3/1998 | Limper-Brenner et al. | 174/52.4 |
| 5,792,984 A | | 8/1998 | Bloom | 174/52.3 |

(Continued)

FOREIGN PATENT DOCUMENTS

JP    9/22969    1/1997

(Continued)

OTHER PUBLICATIONS

Cookson Electronics, "Parylene Applications," http://www.scscookson.com/applications, p. 1, 2003.

(Continued)

*Primary Examiner*—Monica A Huson
(74) *Attorney, Agent, or Firm*—Weingarten, Schurgin, Gagnebin & Lebovici LLP

(57) ABSTRACT

A circuit package for housing semiconductor or other integrated circuit devices ("die") includes a high-copper flange, one or more high-copper leads and a liquid crystal polymer frame molded to the flange and the leads. The flange includes a dovetail-shaped groove or other frame retention feature that mechanically interlocks with the molded frame. During molding, a portion of the frame forms a key that freezes in or around the frame retention feature. The leads include one or more lead retention features to mechanically interlock with the frame. During molding, a portion of the frame freezes in or adjacent these lead retention features. The frame includes compounds to prevent moisture infiltration and match its coefficient of thermal expansion (CTE) to the CTE of the leads and flange. The is frame is formulated to withstand die-attach temperatures. A lid is ultrasonically welded to the frame after a die is attached to the flange.

11 Claims, 11 Drawing Sheets

U.S. PATENT DOCUMENTS

| | | | |
|---|---|---|---|
| 6,204,448 B1 | 3/2001 | Garland et al. | 174/52.3 |
| 6,211,463 B1 | 4/2001 | Fabis | 174/52.5 |
| 6,214,152 B1 | 4/2001 | Ross et al. | 156/245 |
| 6,242,694 B1 | 6/2001 | Muraki | 174/52.3 |
| 6,379,795 B1 * | 4/2002 | Bisaria et al. | 428/378 |
| 6,462,413 B1 | 10/2002 | Polese et al. | 257/732 |
| 6,489,677 B2 | 12/2002 | Okada et al. | 257/712 |
| 6,511,866 B1 | 1/2003 | Bregante et al. | 438/127 |
| 6,521,989 B2 | 2/2003 | Zhou | 257/698 |
| 7,429,791 B2 | 9/2008 | Kurihara et al. | |

FOREIGN PATENT DOCUMENTS

| | | |
|---|---|---|
| JP | 2002-76158 | 3/2002 |
| JP | 2004-179584 | 6/2004 |

OTHER PUBLICATIONS

Cookson Electronics, "SCS Parylene's Benefits to an Electronic Component," http://www.scscookson.com/applications, pp. 1-2, 2003.

Sud-Chemie Group, "Zeolite Powders for various applications," http://www.sud-chemie.com/scmcms/web/content, p. 1.

Sumitomo Chemical Co., Ltd., "Products Sumika Super LCP," http://www.sumitomo-chem.com.jp/sep/english/0221LCP/LCP_41densi.html, pp. 1-13, 2001.

Cluff et al., *10A.1 Electronic Packaging Technologies*, CRC Press LLC (*2001*).

* cited by examiner

DETAIL A

SECTION C-C

THERMOPLASTIC MATERIAL

CROSS REFERENCE TO RELATED APPLICATIONS

This application is a divisional of application Ser. No. 10/767,309, filed Jan. 29, 2004 now U.S. Pat. No. 6,867,367, which claims the benefit of provisional Application No. 60/443,470, filed Jan. 29, 2003.

STATEMENT REGARDING FEDERALLY SPONSORED RESEARCH OR DEVELOPMENT

Not Applicable

BACKGROUND OF THE INVENTION

This application relates to circuit packages for integrated circuits and, more particularly, to circuit packages that include metal flanges and high-temperature thermoplastic frames.

Semiconductor and other integrated circuit devices (sometimes referred to as "chips" or "die") are typically mounted inside circuit packages to protect the die and to facilitate electrically, mechanically and thermally connecting the die to printed circuit boards, heat sinks and the like. A typical circuit package includes a base (commonly referred to as a "slug" or "flange"), a protective insulating housing and leads extending through the housing. Inside the housing, the leads are electrically bonded directly, or more commonly by wires, to contacts on the die.

The protective housing is made of a dielectric material, such as plastic or ceramic, and is attached to the flange to encapsulate the die and bonding wires and to protect them against intrusion of water vapor and other atmospheric gases. Most protective housings comprise two pieces, i.e. a set of sidewalls (a "frame") and a lid, although some housings are molded as one-piece assemblies. The order in which the frame and the die are attached to the flange varies, depending on the material of the frame and, more particularly, the maximum temperature the material can tolerate without deforming or being otherwise damaged.

A circuit package for a high-power die typically includes a metal flange, to which the die is attached, often by eutectic soldering. The flange typically provides mounting features, such as screw holes or slots, by which the circuit package can be mounted, such as to a heat sink. In use, the flange conducts heat from the die to the heat sink.

The high temperature used to attach a die to a flange can damage or deform plastic, however ceramic materials are able to withstand this high temperature. A circuit package that employs a ceramic frame can, therefore, be assembled prior to the attachment of the die. A lid is then adhered to the frame, such as by epoxy.

To match the coefficients of thermal expansion of ceramic frames, flanges for these frames are typically made of a copper-tungsten alloy by a powder metallurgy infiltration process. This process is very expensive, and the thermal conductivity of the resulting alloy is limited. Improved thermal conductivity can be achieved through the use of copper-molybdenum-copper laminated flanges fabricated by an infiltration process followed by a lamination process, however these processes are very expensive.

Alternatively, the die can be attached to the flange prior to attaching the frame and lid. This approach enables use of low-temperature plastic for the frame, however adhesives used to attach the frame to the flange and to the lid perform less than satisfactorily. These adhesives often create imperfect seals or permit gaps to open during use of the circuit package. Furthermore, users of circuit packages prefer not to inventory flanges, frames and lids and assemble these pieces after attaching die to flanges.

BRIEF SUMMARY OF THE INVENTION

The present invention provides a low piece-count, low cost circuit package that can withstand high die-attach temperatures and can provide a hermetically sealed air cavity for a die, without the use of adhesives. The circuit package design employs a number of mechanical features and compositions to achieve this hermeticity and temperature tolerance. This combination also provides a circuit package that exhibits better electrical and thermal conductivity and mechanical integrity than conventional circuit packages.

The circuit package includes two parts: a flange/frame/lead(s) combination and a lid. The leads extend through sidewalls of the open-top frame. The flange includes a die-attach area surrounded by the frame. A seal is applied inside the frame along boundaries between the flange and the frame and between the leads and the frame. Materials for the frame (thermoplastic, preferably liquid crystal polymer) and seal (preferably epoxy) are formulated to withstand die-attach temperatures. Once a die is attached to the flange and the die is electrically bonded to the leads, the lid is welded to the frame to seal the air cavity around the die.

The flange, frame and leads of the circuit package include one or more structural features to maintain mechanical integrity of the circuit package without use of adhesives. These features mechanically lock the flange and leads to the frame at their respective junctions.

In one embodiment, the flange defines a frame retention feature surrounding the die-attach area. The retention feature can be, for example, a groove or ridge that includes a dovetail or other undercut cross-sectional shape. The thermoplastic frame is molded to the flange, such as by injection molding. During molding, a portion of the frame forms a key that freezes in or around the retention feature, thus mechanically securing the frame to the flange.

In another embodiment, each lead includes one or more lead retention features to secure the lead to the frame. During the molding operation, the frame is also molded around the lead, which extends from outside the frame, through a sidewall of the frame, into the air cavity area.

One lead retention feature defines at least one hole through the lead. During molding, some frame thermoplastic flows through, and then freezes in, the hole, thus locking the lead within the frame.

Another lead retention feature provides a hooked edge, ridge or other structure on or near the end of the lead that resides within the air cavity area. This structure is not coplanar with the lead. During molding, some frame thermoplastic freezes against an outward-facing portion of this structure, thereby creating a mechanical barrier that prevents the lead from being pulled out of the frame.

Compositions of the flange, frame and leads provide matching coefficients of thermal expansion (CTE), thus reducing stress on the respective junctions between these parts. These compositions also provide good thermal conductivity by the flange and good electrical conductivity by the leads and the flange. In one embodiment, the flange is made with a high copper content, augmented by a small amount of zirconium, silver or other material. In another embodiment, the leads are made with a high copper content, augmented by a small amount of iron, phosphorus, zinc and/or other material. In yet another embodiment, graphite flakes in the frame form a moisture barrier. These graphite flakes and other additives match the CTE of the frame to the CTE of the flange. An optional film can be applied to the exterior or interior of the frame and/or lid to further reduce moisture infiltration into the air cavity.

BRIEF DESCRIPTION OF THE SEVERAL VIEWS OF THE DRAWINGS

These and other features, advantages, aspects and embodiments of the present invention will become more apparent to those skilled in the art from the following detailed description of an embodiment of the present invention when taken with reference to the accompanying drawings, in which.

DETAILED DESCRIPTION OF THE INVENTION

The contents of application Ser. No. 10/767,309, filed Jan. 29, 2004, and the contents of provisional Application No. 60/443,470, filed Jan. 29, 2003, are hereby incorporated by reference.

Figure 1:
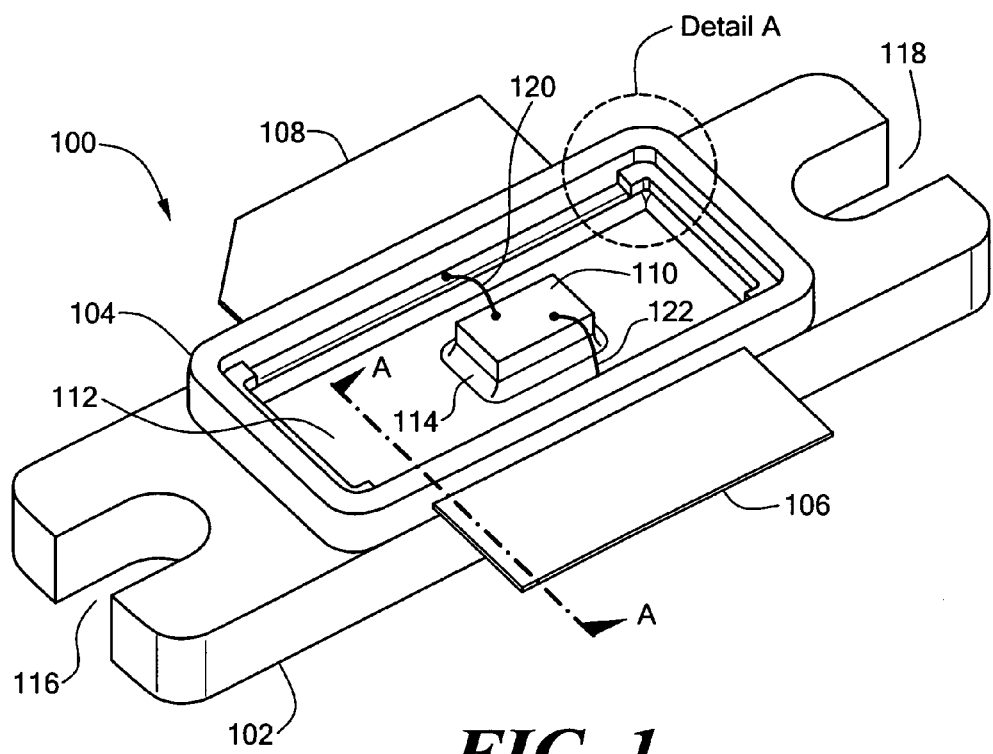
FIG. 1 is a perspective view of a circuit package, without a lid, according to one embodiment of the present invention.

The present invention provides a low piece-count circuit package that can withstand high die-attach temperatures and can provide a hermetically sealed air cavity for a die, without the use of adhesives. FIG. 1 shows an exemplary circuit package 100, according to one embodiment of the present invention. For clarity, the circuit package 100 is shown without a lid. The circuit package 100 includes a flange 102, a frame 104 and two leads 106 and 108. The frame 104 electrically insulates the leads 106 and 108 from the flange 102 and each other. A die 110 is attached to a die-attach area 112, such as by eutectic solder 114. For clarity, FIG. 1 shows only one die, although typically two or more die can be attached to the die-attach area 112.

Figure 2:
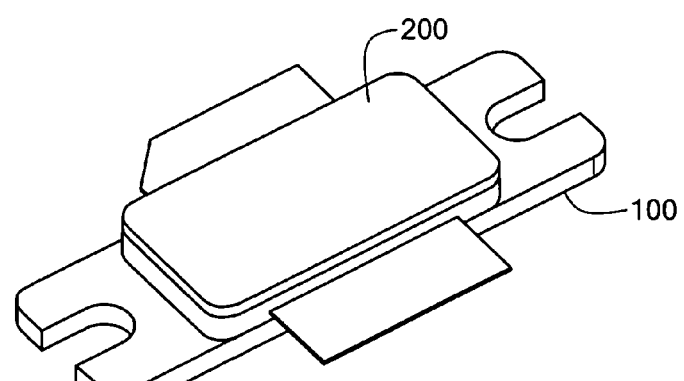
FIG. 2 is a perspective view of the circuit package of FIG. 1 with a lid attached thereto.

The eutectic solder 114 electrically bonds the die 110 to the flange 102. The eutectic solder 114 also conducts heat away from the die 110 to the flange 102. In use, the flange 102 is typically mounted to a heat sink (not shown) by bolts (not shown) extending through slots 116 and 118. The die 110 is electrically bonded to the leads 106 and 108, such as by wires 120 and 122. These wires 120 and 122 are preferably ultrasonically bonded to the leads 106 and 108. Although one die 110 and two leads 106 and 108 are shown, more die and/or leads can be used. FIG. 2 shows the circuit package 100 after a lid 200 has been attached thereto, as described in more detail below.

The circuit package 100 employs a number of mechanical features and compositions to hermetically seal the die within the air cavity and to tolerate high temperatures. As previously noted, this combination also enables the circuit package 100 to exhibit enhanced electrical and thermal conductivity and mechanical integrity. The following description begins with an overview of a process for manufacturing the circuit package 100. There then follows a detailed description of the flange 102 and its manufacture. This is followed by detailed descriptions of the leads 106 and 108, composition of the liquid crystal polymer used for the frame 104, a seal applied inside the frame 104, the lid 200 and a process for manufacturing the circuit package 100.

Manufacturing Overview

Figure 3:
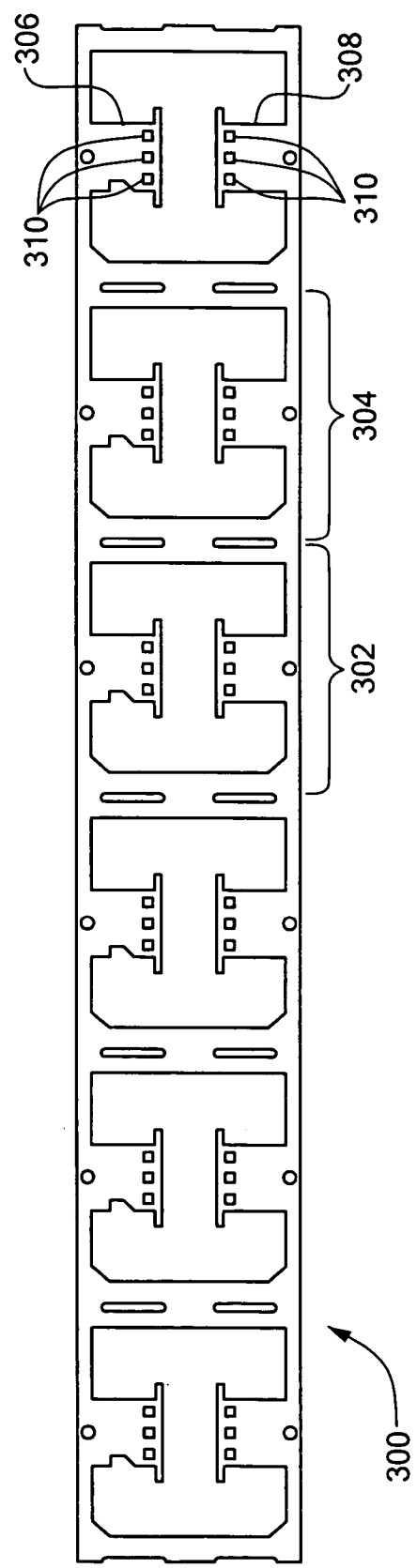
FIG. 3 is a top view of a strip of lead frames, such as those used to manufacture the circuit package of FIG. 1.

Circuit packages 100, according to the present invention, are preferably fabricated in strips or on reels, similar to conventional circuit packages. FIG. 3 shows a strip 300 of lead frames, such as lead frames 302 and 304. Each lead frame includes two leads, such as those shown at 306 and 308. In one embodiment, when the lead frame strip 300 is stamped or etched, holes are created through the leads 306 and 308. Examples of these holes are shown at 310. These holes 310 are used to lock a frame to the leads 306 and 308, as described in detail below.

Figure 4A:
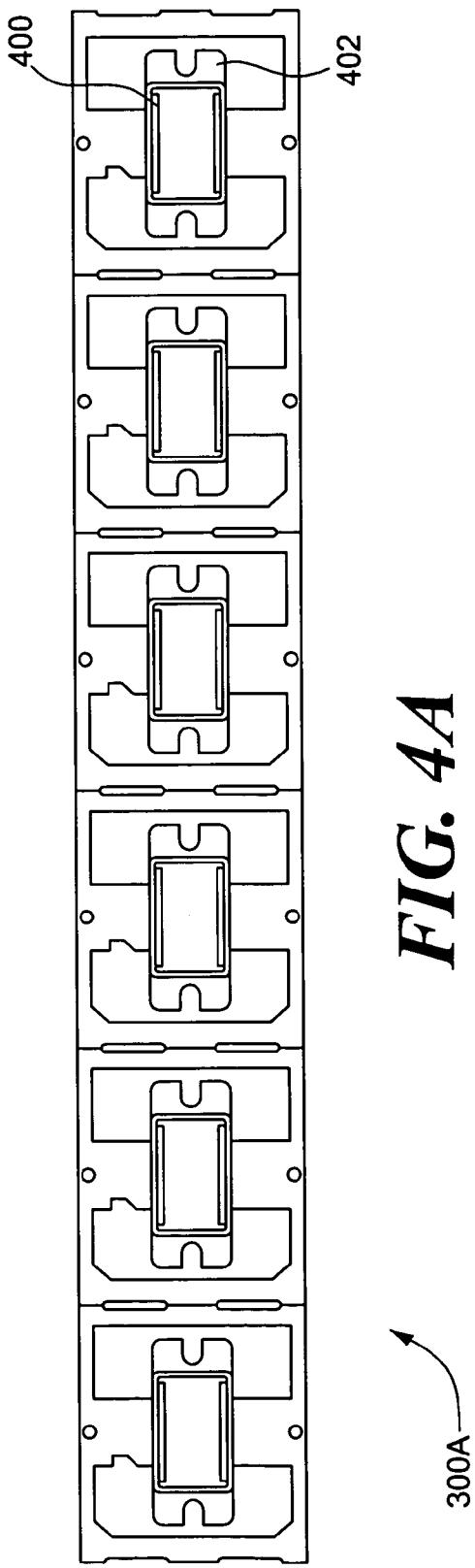
FIG. 4A is a top view of the strip of lead frames of FIG. 3 after frames and flanges have been molded thereto.
Figure 4B:
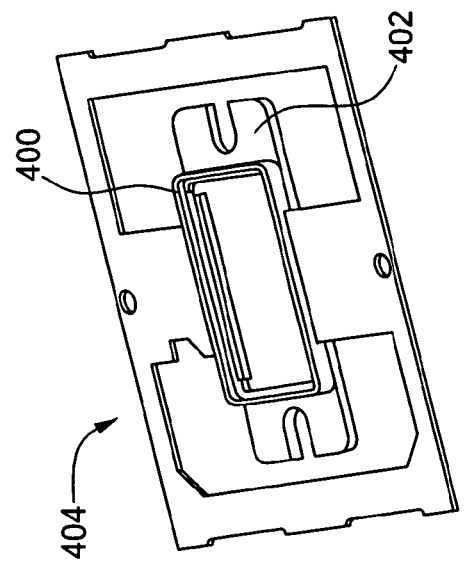
FIG. 4B is a perspective view of one lead frame of the strip shown in FIG. 4A.

After the lead frame strip 300 is made, a frame is molded, preferably by injection molding, to each lead frame of the lead frame strip. FIG. 4A shows the lead frame strip 300A after frames, such as frame 400, have been molded to the lead frames. FIG. 4B shows one complete lead frame 404. Lead frames can be supplied individually or in strips or reels to subsequent manufacturers, who attach die to them.

Flange

The flange 102 forms a base, to which other parts of the present circuit package are attached. In addition, the flange 102 typically conducts heat from a die to a heat sink and electrically bonds one terminal of the die to a circuit board. The flange 102 is preferably made of a high-copper alloy (at least about 50% copper) to provide high electrical and thermal conductivity and to resist annealing at die-attach temperatures. The alloy preferably includes at least one trace metal. The flange 102 preferably comprises at least about 98% copper and between about 0.05% and about 1.5% zirconium, although other high-copper ratios are acceptable. The flange 102 more preferably comprises about 99.9% copper and about 0.1% zirconium. The flange 102 is preferably electroplated with about 100 micro-inches of nickel to form a diffusion barrier layer and about 65 micro-inches of gold to facilitate soldering the die 110 to the flange.

Alternatively, the flange 102 comprises at least about 99.5% copper and about 0.085% silver, although other high-copper ratios are acceptable. Zirconium is preferred to silver, because an alloy made with zirconium can contain a higher copper content and thus provide better thermal and electrical conductivity than if it is made with silver. The copper-zirconium alloy provides a flange with a thermal conductivity superior to prior art copper-tungsten and copper-molybdenum-copper flanges, which enables a circuit package that employs such a flange or a die attached to such a flange to dissipate more power than prior art packages. In addition, the copper-zirconium alloy has a higher annealing temperature than most high-copper alloys and is subject to less warpage as a result of being heated to die-attach temperatures.

As previously noted, the frame 104 is molded, preferably by injection molding, to the flange 102. As a result of this molding, the frame adheres to the flange 102, although this adhesion is typically imperfect and subject to breakdown due to the heat of soldering and operation of the die. To overcome this problem, the flange 102 preferably includes a mechanical feature to mechanically interlock the frame 104 and the flange.

Figure 5A:
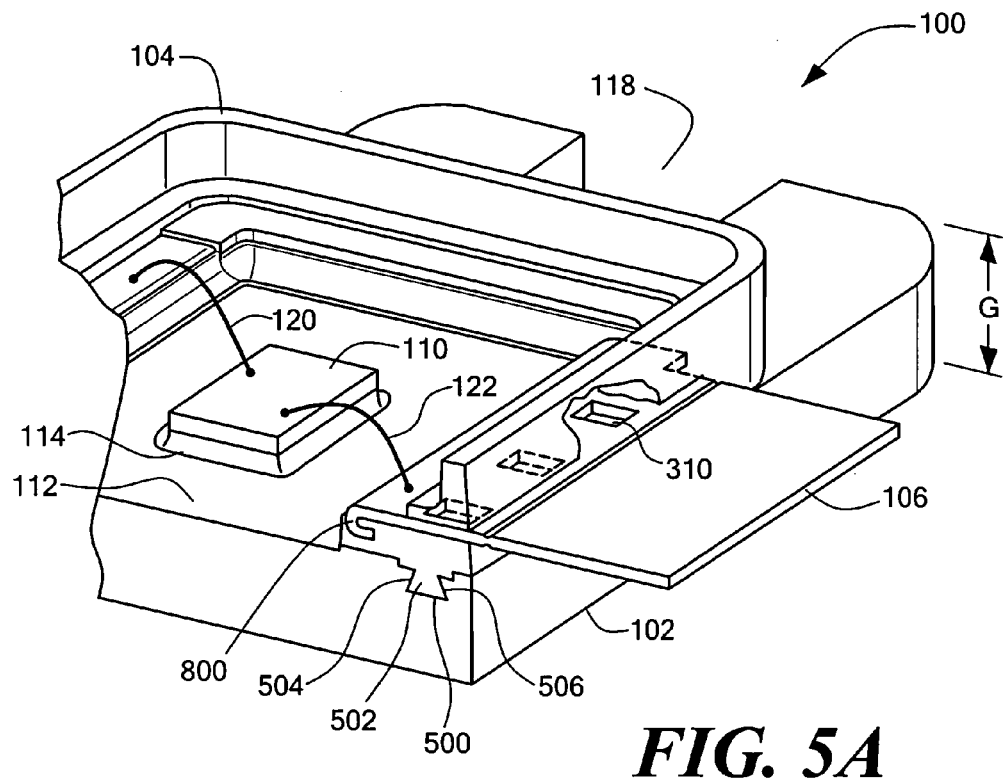
FIG. 5A is a cut-away view of a portion of the circuit package of FIG. 1.

This feature is shown in FIG. 5A, which is a cut-away view of a portion the circuit package 100 discussed above with reference to FIG. 1. The flange 102 defines a frame retention feature 500, which is used to mechanically interlock the frame 104 and the flange. When the frame 104 is molded to the flange 102, some of the frame material flows into, and then freezes in, the frame retention feature 500, forming a key 502. The frame retention feature 500 has a cross-sectional profile, and the key 502 takes on a complementary profile. Thus, the frozen key 502 mechanically interlocks with the frame retention feature 500, thereby preventing the frame 104 from being pulled away from the flange 102 without requiring an adhesive to be added between the frame and the flange.

The frame retention feature 500 includes at least one undercut portion. In cross-section, the retention feature 500 is preferably a dovetail shape, which defines two undercut portions 504 and 506. Other cross-section shapes, such as a T, L or lollipop, are acceptable.

Figure 5B:
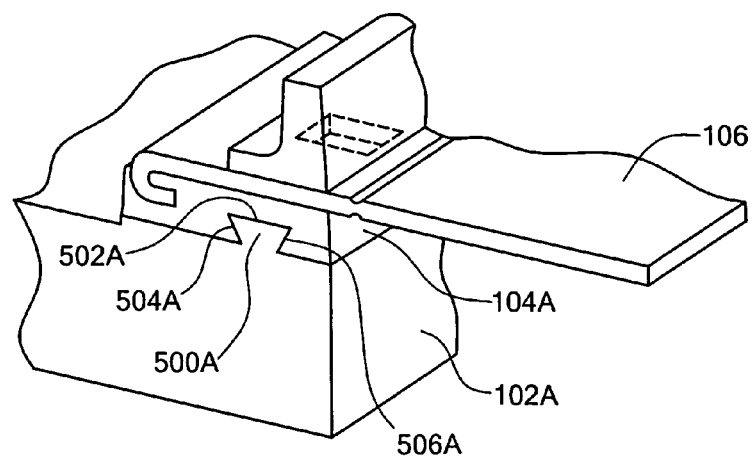
FIG. 5B is a cut-away view of a portion of an alternative embodiment of the circuit package of FIG. 1.

Although the frame retention feature 500 shown in FIG. 5A is depressed below the adjacent surface of the flange 102, the frame retention feature can alternatively stand proud of the adjacent surface, as shown in FIG. 5B. Alternative flange 102A defines a frame retention feature 500A that stand proud of the adjacent surface. When a frame 104A is molded to the flange 102A, some of the frame material flows around, and freezes below, undercut portions 504A and 506A of the frame retention feature 500A. In this case, the frame 104A defines a key 502A that is within the frame 104A.

Figure 6A:
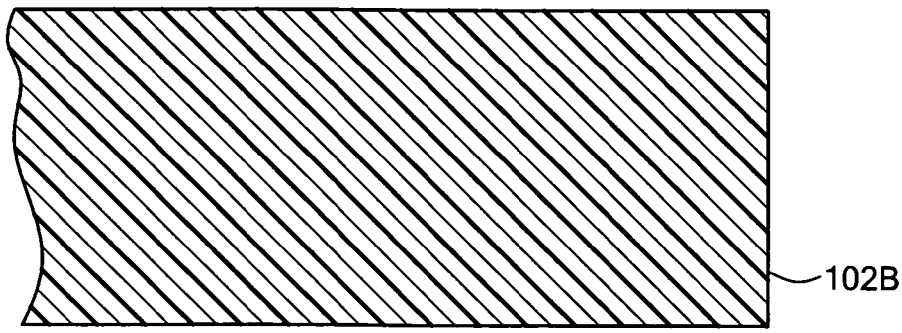
FIGS. 6A-C are cross-sectional views of the flange of the circuit package of FIG. 1 showing three stages of manufacture thereof.
Figure 6B:
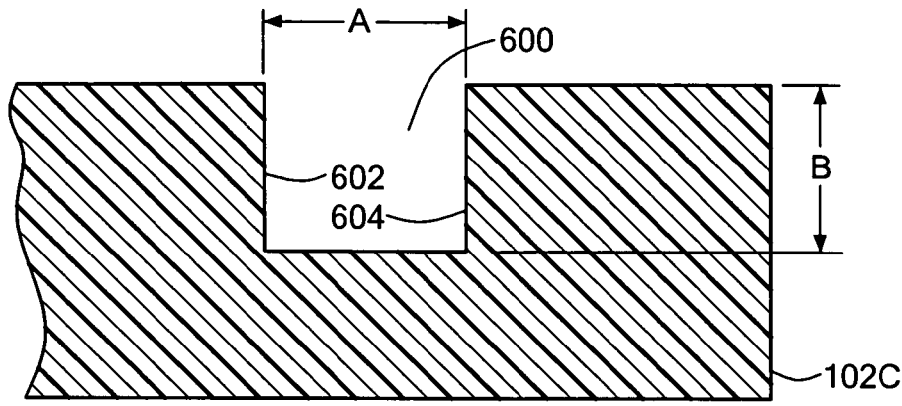
Figure 6C:
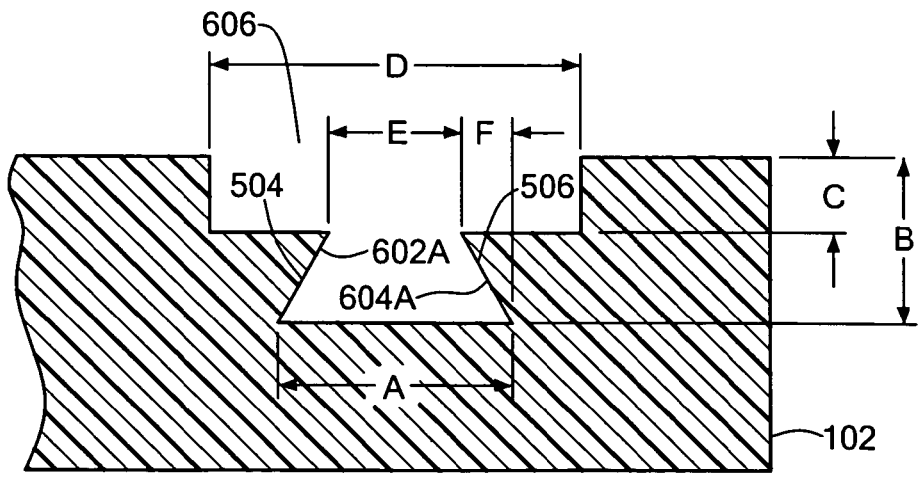

Returning to FIG. 5A, the frame retention feature 500 is formed in the flange 102 by a series of progressive stampings. FIGS. 6A-C show cross-sections of the frame retention feature 500 at various stages of manufacture. FIG. 6A shows a flange blank 102B before the frame retention feature 500 has been made.

FIG. 6B shows a flange blank 102C after a first rectangular cross-section groove 600 has been coined in the flange blank. This coining operation creates walls 602 and 604 in the groove 600. The groove 600 is preferably about 0.02 inches wide (dimension A) and preferably about 0.02 inches deep (dimension B).

FIG. 6C shows the flange 102 after a second rectangular cross-section groove 606 has been coined over the first groove 600. The second coining operation deforms the walls 602 and 604 (FIG. 6B), causing them to collapse slightly near the top of the groove. Deformed walls 602A and 604A form the undercuts 504 and 506 discussed above, with reference to FIG. 5A. The second groove 606 is preferably about 0.05 inches wide (dimension D) and preferably about 0.01 inches deep (dimension C). The resulting dovetail shape has a smaller dimension of about 0.007 inches (dimension E), leaving an overhang of about 0.0065 inches (dimension F). The overhang (F) is preferably at least about 0.005 inches for the liquid crystal polymer (described below) used for the frame 104.

All these dimensions can vary depending on the size, material and temperature of the flange 102, the size, material and temperature of the frame 104, the desired strength of the junction between the flange and the frame, cost or other factors that are now well within the skill of an ordinary practitioner.

The flange 102 also includes a mechanical feature to ensure a good heat transfer connection between the flange and a heat sink. Heat sinks are typically machined flat on one surface. To provide a good heat-conducting junction between a circuit package and a heat sink, the circuit package should lie flat against this flat surface, without gaps therebetween.

The stamping operations (described above) performed to create the frame retention feature 500 can deform the bottom of the flange 102, thereby preventing the circuit package from lying flat against the heat sink. To ameliorate this deformation, the bottom of the flange 102 is preferably lapped after the stamping operations. In addition or alternatively, increasing the thickness (dimension G in FIG. 5A), preferably to about 0.125 inches, can reduce the amount of deformation caused by the stamping operations and can eliminate the need to lap the bottom of the flange 102.

Figure 7A:
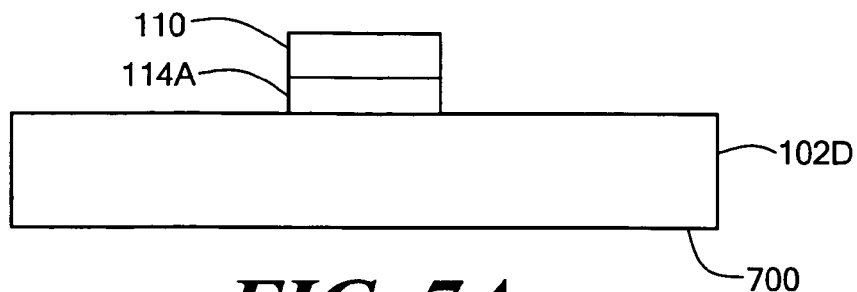
FIGS. 7A-D are schematic drawings of a die being attached to the flange of the circuit package of FIG. 1.

Differences in coefficients of thermal expansion (CTE) between the die 110 and the flange 102 can deform the flange when the die is soldered to the flange. FIGS. 7A-D schematically illustrate this circumstance. FIG. 7A shows a flange 102D with a flat bottom 700 and a die 110 that has not yet been soldered to the flange. Solder material 114A has not yet been melted. The CTE of a copper/zirconium flange is approximately 17 ppm/° C., whereas the CTE of a silicon die is approximately 2.8 ppm/° C. As the die 110 and flange 102D are heated to solder the die to the flange, the die and flange expand.

Figure 7B:
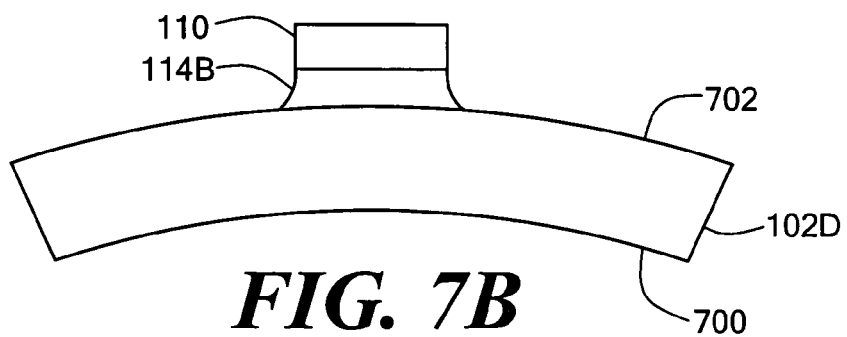

Later, and shown in FIG. 7B, as the die 110 and flange 102D cool, eutectic solder 114B suddenly hardens, but the flange and die continued to cool and contract. The eutectic solder 114B is very hard and not very ductile. Therefore, the contraction of the top surface 702 of the flange 102D is constrained by the die 110, which has a much smaller CTE than the flange. As a result, the top surface 702 of the flange 102D contracts less than the bottom surface 700, causing the bottom surface to take on a concave shape, which can leave a gap when the flange is mounted to a heat sink.

Figure 7C:
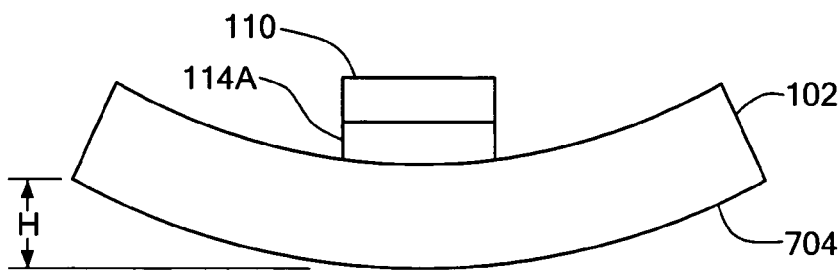

To counteract the tendency of the flange 102 to take on a concave shape after soldering, the flange is preferably given a slightly convex shape prior to the soldering. FIG. 7C shows the flange 102 before the die 110 is soldered thereto. The bottom surface 704 of the flange 102 is given a shape, whose convexity (dimension H) is greater than the amount of concavity that would be introduced by soldering. In one embodiment, the bottom surface 704 is convex at least by about 0.0001 inches over the length of the flange. In another embodiment, the bottom surface 704 is convex by between about 0.0005 inches and about 0.0010 inches. This amount can be varied depending on various factors, such as the soldering technique used, the number, size and placement of die soldered to the flange, the length, width and thickness of the flange and the composition of the flange. Conventional flanges are typically about 0.040 or 0.062 inches thick. A flange thickness (dimension G in FIG. 5A) of preferably about 0.125 inches can reduce the amount of deformation caused by the soldering. The bottom surface convexity is preferably imparted by a coining process, although other processes, such as sanding, bending, casting or forging are acceptable.

Figure 7D:
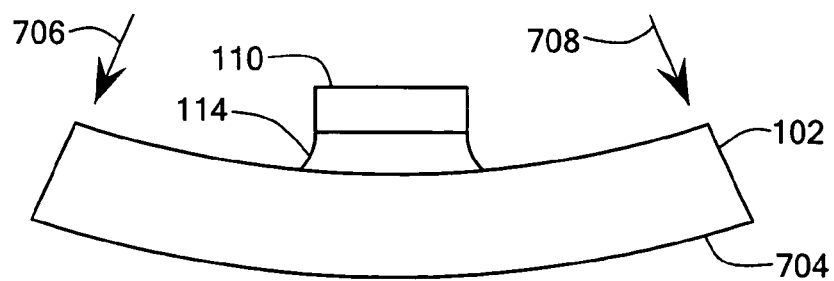

FIG. 7D shows the flange 102 after the die 110 has been soldered thereto and both have cooled. The bottom surface 704 preferably has a slightly convex shape. When the flange 102 is mounted to a heat sink, forces applied by mounting screws to the flange (as indicated by arrows 706 and 708) flatten the flange against heat sink and creates a good heat-transfer junction between the flange and heat sink.

As previously noted, the flange 102 includes a generally planar die-attach area 112, to which the die 110 is soldered, epoxied or otherwise attached. The die-attach area 112 is preferably flat to within about 0.001 inches per inch, and more preferably to within about 0.0005 inches per inch, to facilitate a good eutectic solder connection between the die 110 and the die-attach area. In addition, the die-attach area surface roughness is preferably less than about 30 micro-inches for eutectic soldering. The surface roughness of the bottom of the flange 102 is preferably less than about 64 micro-inches to facilitate making good head-conducting contact with a heat sink. If an adhesive, such as epoxy, is used to attach the die 110 to the die-attach area 112, the die-attach area is preferably flat to within about 0.005 inches per inch and smooth to within about 64 micro-inches.

Also as previously noted, the flange 102 includes mounting slots 116 and 118. Alternatively, the flange 102 can include threaded or unthreaded mounting holes. In these cases, the flange 102 can be mounted to a heat sink or other substrate by bolts or other fasteners extending through these openings. Alternatively, the flange 102 can be soldered to a heat sink or other substrate, obviating the need for mounting slots.

Leads

As previously noted with reference to FIG. 1, the frame 104 is molded, preferably by injection molding, to the flange 102 and to the leads 106 and 108. During the molding operation, the frame 104 is molded preferably around the leads 106 and 108, which extend from outside the frame, through sidewalls of the frame, into the air cavity area. As a result of this molding, the frame adheres to the leads 106 and 108, although this adhesion is typically imperfect and subject to breakdown due to the heat of soldering and operation of the die. To overcome this problem, each lead 106 and 108 preferably includes one or more lead retention features to secure the lead to the frame 104.

Figure 8A:
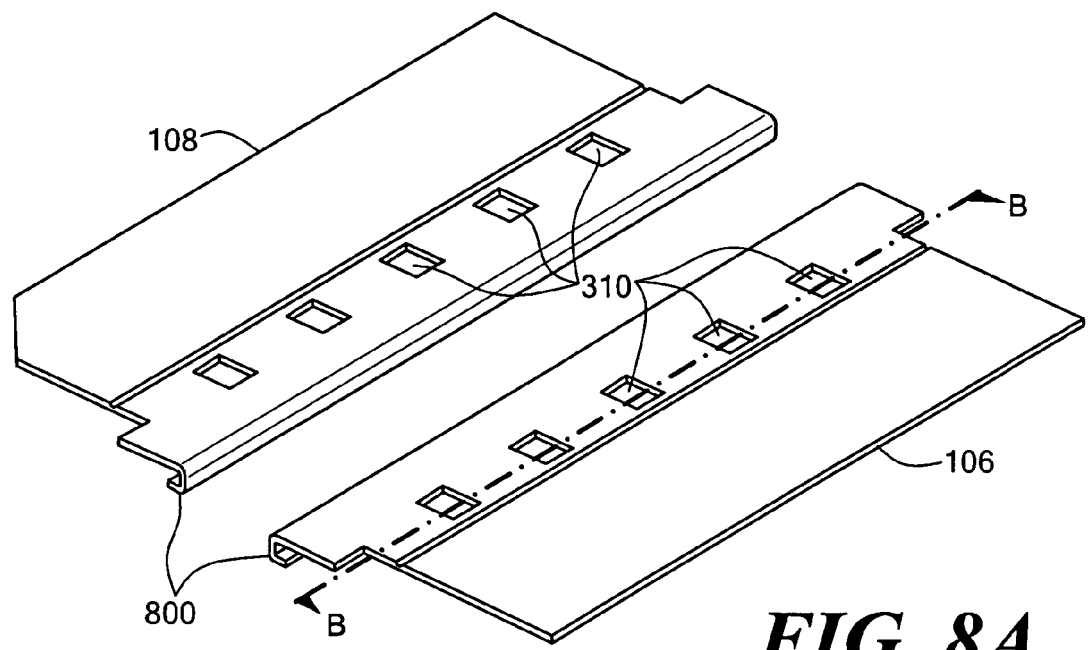
FIG. 8A is a detailed perspective view of the leads of the circuit package of FIG. 1.

One lead retention feature defines at least one hole 310 through each lead, as shown in FIG. 8. As previously noted, the holes 310 are formed in the leads 106 and 108 when the lead frame 300 (FIG. 3) is stamped or etched. Preferably, each lead 106 and 108 includes a plurality of preferably rectangular holes 310 arranged in a line where the frame 104 will contact the lead. During molding, some frame thermoplastic flows into, and then freezes in, the holes 310, thus mechanically locking the lead 106 or 108 within the frame 104 and preventing the lead from being pulled out of the frame without requiring an adhesive to be added between the lead and the frame. As shown in FIG. 5A, the holes 310 are preferably completely covered by the frame 104.

Electrical conductivity of the leads 106 and 108 contributes to the overall performance of the circuit package 100. The conductivity of a lead 106 or 108 is proportional to a lateral, i.e. approximately perpendicular to the direction of current flow through the lead, cross-sectional area of the lead. Because the holes 310 reduce this cross-sectional area (see section line B-B in FIG. 8), the number, placement, size and shape of the holes can be selected to minimize the loss in effective conductivity of the leads 106 and 108. Preferably, the holes 310 reduce the cross-sectional area of the lead at most by about 25%, although this reduction can be greater if the conductivity of the resulting lead meets design criteria.

Rectangular holes 310 maximize the amount of frame thermoplastic that can freeze and lock the leads 106 and 108, while minimizing the reduction in conductivity of the leads. The longer dimensions of the rectangular holes 310 are preferably aligned parallel to the direction of current flow through the leads 106 and 108. Depending on the thickness of the sidewalls of the frame 104, the holes 310 can be square.

Figure 8B:
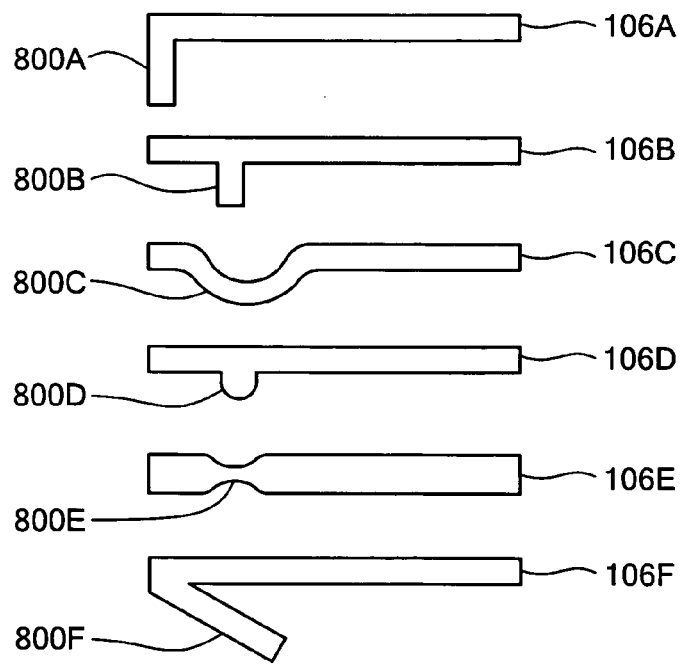
FIG. 8B is a cross-sectional diagram of several alternative embodiments of the leads of the circuit package of FIG. 1.

Another lead retention feature, shown in FIG. 8, provides a hooked or bent (hereinafter collectively "hooked") edge 800, ridge, depression or other structure on or near the end of the lead 106 or 108 that resides within the air cavity area. This structure is not co-planar with the lead. As can be seen in FIG. 5A, during molding, some frame thermoplastic freezes in or against an outward-facing portion of this structure, thereby creating a mechanical barrier that prevents the lead 106 from being pulled out of the frame 104. The hooked edge 800, ridge or other structure is formed in the leads 106 and 108 when the lead frame 300 (FIG. 3) is stamped. Although a hooked edge 800 is the preferred embodiment for this lead retention feature, other shapes can be used. Examples of some acceptable shapes are shown in cross-section in FIG. 8B at 800A-F.

As previously discussed with reference to FIG. 1, the leads 106 and 108 are used to electrically connect the die 110 to a circuit board or the like. The leads 106 and 108 are made of a high-copper alloy (at least 50% copper) to provide good electrical conductivity and to match the CTE of the frame 104. High-copper leads provide electrical conductivity that is superior to prior art leads, which typically comprise 42% nickel and 55% iron (commonly known as Alloy 42). In addition, the leads 106 and 108 are preferably electroplated with about 100 micro-inches of nickel to form a diffusion barrier layer and about 65 micro-inches of gold to facilitate wirebonding or lead soldering the leads.

The leads 106 and 108 are preferably made of an alloy of between about 2.1% and about 2.6% iron, between about 0.015% and about 0.15% phosphorus, between about 0.05% and about 0.2% zinc, with the balance copper. Other ratios of these materials are, however, acceptable. The leads 106 and 108 are more preferably made of about 97.5% copper, about 2.35% iron, about 0.3% phosphorus and about 0.12% zinc. Such an alloy is available from Olin Corporation under the UNS designation C19400.

Many alternative compositions for the leads 106 and 108 are acceptable. One such alternative includes about 99.9% copper and about 0.1% zirconium. Such an alloy is available from Olin Corporation under UNS designation C15100. Other ratios of these materials are, however, acceptable. For example, an alloy made of between about 0.05% and about 0.15% zirconium, with the balance copper, is also acceptable.

Another alternative composition for the leads 106 and 108 includes between about 1% and about 2% iron, between about 0.01% and about 0.035% phosphorus, between about 0.3% and about 1.3% cobalt, between about 0.1% and about 1% tin and the balance copper. The preferred amount of copper in this composition is 97%. Such an alloy is available from Olin Corporation under UNS designation C19500.

Another alternative composition for the leads 106 and 108 includes between about 0.3% and about 1.2% iron, between about 0.1% and about 0.4% phosphorus, between about 0.01% and about 0.2% magnesium, and the balance copper. The preferred formulation in this alternative composition is about 0.6% iron, about 0.2% phosphorus, about 0.05% magnesium and about 99% copper. Such an alloy is available from Olin Corporation under UNS designation C19700.

Another alternative composition for the leads 106 and 108 includes between about 1.7% and about 2.3% tin, between about 0.1% and about 0.4% nickel, up to about 0.15% phosphorus and the balance copper. Such an alloy is available from Mitsubishi Electric Corporation under UNS designation C50710.

Yet another alternative composition for the leads 106 and 108 includes between about 0.05% and about 1.5% iron, between about 0.025% and about 0.04% phosphorus and the balance copper. Such an alloy is available from Kobe Steel, Ltd. under UNS designation C19210.

Yet another alternative composition for the leads 106 and 108 includes between about 0.5% and about 0.15% iron, between about 0.5% and about 1.5% tin, between about 0.01% and about 0.035% phosphorus and the balance copper. Such an alloy is available from Mitsubishi Shinto Company, Ltd. under UNS designation C19520.

Another alternative composition for the leads 106 and 108 includes between about 0.15% and about 0.4% chromium, between about 0.01% and about 0.4% titanium, between about 0.02% and about 0.07% silicon and the balance copper. Such an alloy is available from Wieland Werke under UNS designation C18070.

Yet another alternative composition for the leads 106 and 108 includes between about 0.8% and about 1.8% nickel, between about 0.15% and about 0.35% silicon, between about 0.01% and about 0.05% phosphorus and the balance copper. Such an alloy is available from Poong San Metal Corporation under UNS designation C19010.

Another alternative composition for the leads 106 and 108 includes between about 2.0% and about 4.8% nickel, between about 0.2% and about 1.4% silicon, between about 0.05% and about 0.45% magnesium and the balance copper. The preferred formulation in this alternative composition is about 3.0% nickel, about 0.65% silicon, about 0.15% magnesium and about 96.2% copper. Such an alloy is available from Olin Corporation under UNS designation C70250.

Yet another alternative composition for the leads 106 and 108 includes between about 0.3% and about 0.4% chromium, between about 0.2% and about 0.3% tin, between about 0.15% and about 0.25% zinc and the balance copper. Such an alloy is available from Furukawa Electric under UNS designation EFTEC-64T.

Another alternative composition for the leads 106 and 108 includes between about 2.7% and about 3.7% nickel, between about 0.2% and about 1.2% silicon, between about 0.1% and about 0.5% zinc and the balance copper. Such an alloy is available from Kobe Steel, Ltd. under UNS designation KLF-25.

Yet another alternative composition for the leads 106 and 108 includes between about 1.9% and about 2.9% nickel, between about 0.2% and about 0.6% silicon, between about 0.1% and about 0.2% phosphorus and the balance copper. Such an alloy is available from Mitsubishi Electric Corporation under UNS designation MF224.

Frame

As noted above, with respect to FIG. 5A, the frame 104 is made of injection molded thermoplastic and is molded to the flange 102 and to the leads 106 and 108. The material of the flange 102 preferably includes a liquid crystal polymer (LCP) that can withstand die-attach temperatures (280-330° C. for AuSn soldering or 390-420° C. for AuSi soldering). Conventional LCPs melt at temperatures between about 300° C. and about 330° C. The frame 104 preferably includes base resins and compounds to raise its melting temperature, adjust its coefficient of thermal expansion (CTE) and reduce its permeability to moisture. For convenience, the material of the frame 104, including the resins and compounds, is referred to here herein as a "thermoplastic compound" or "frame material."

An example of an acceptable resin is one that includes para-hydroxybenzoic acid, bisphenol and phthalic acid. Another acceptable formulation includes a copolymer of p-hydroxybenzoic acid (HBA) and 6-hydroxy-2-naphthoic acid (HNA). Other acceptable formulations include terpolymers of HBA, 4-4-bisphenol (BP) and terephthalic acid (TA).

Figure 9:
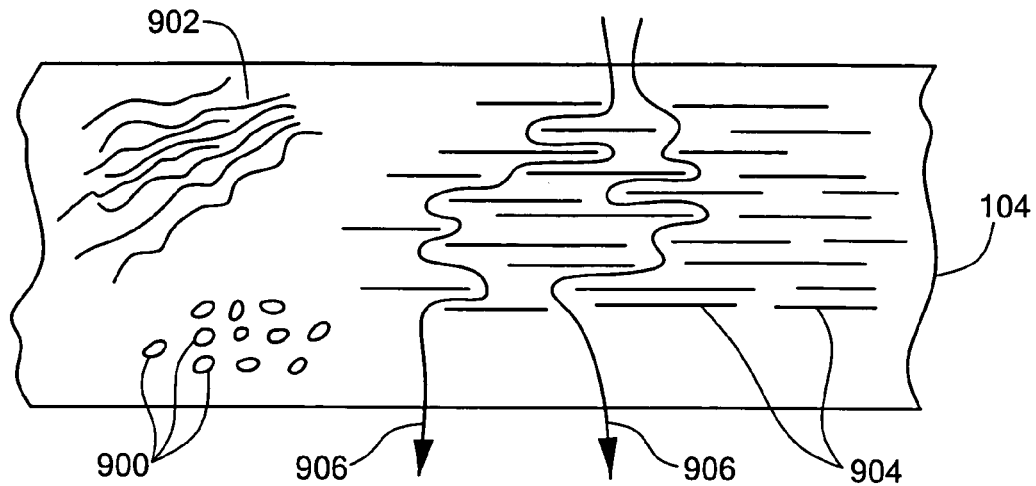
FIG. 9 is a schematic cross-sectional diagram of a portion of the frame of the circuit package of FIG. 1.

FIG. 9 is a schematic cross-section diagram of the frame 104 showing some of the compounds in the thermoplastic compound. Filler particles are preferably added to the LCP to modify its CTE to more closely match the CTE of the leads 106 and 108 (approximately 17 ppm/° C.) and to disrupt the anisotropy of the thermoplastic compound in the frame 102. The CTE of the frame material is preferably adjusted to be within about 60% of the CTE of the leads 106 and 108. Spherical balls of minerals 900, such as talc, preferably about 2 to 3 microns in diameter, can be added to the LCP at concentrations of about 30% to about 40%. Such a composite has a CTE of about 7 ppm/° C. to 22 ppm/° C.

Graphite is preferably added to the LCP to reduce moisture infiltration. This graphite is preferably in the form of generally planar graphite flakes 904 (shown edge-on in FIG. 9), however other forms of graphite, such as balls or chunks, are also acceptable. In addition, the graphite flakes 904 can warp somewhat during injection, etc., without significantly altering their effectiveness. The term "generally planar graphite flakes" includes such flakes that have been deformed.

The graphite flakes 904 preferably form layers, preferably roughly parallel to exterior surfaces of the frame 104, thus creating tortuous paths 906 for moisture infiltration. Even if the layers are not parallel to the exterior surfaces, the presence of the graphite inhibits moisture infiltration. The graphite flakes 904 also adjust the CTE of the LCP to more closely match the copper alloy of the leads 106 and 108. The frame material contains between about 10% and about 70% graphite flakes, preferably between about 40% and about 50%.

As an alternative to graphite flakes, glass fiber 1202 can be added to the LCP to increase rigidity and adjust CPE of the resulting thermoplastic compound. In this embodiment, the frame material preferably contains between about 30% and about 50% glass fiber.

As another alternative, or in addition, to the graphite flakes, other compounds can be added to the LCP, such as iron powder based absorbers, molecular sieve filters (zeolites) and calcium oxide (CaO). Suitable zeolites are available from Sud-Chemie, Inc.

The frame material is preferably pre-dried, preferably to less than about 0.008% moisture content, before injection molding. In addition, injection times should be kept short, preferably less than about 0.2 seconds. Injection shot sizes should be kept small, preferably less than about 2 grams, to minimize residence time of the thermoplastic compound in the injection molder barrel. A gate at the injection site preferably restricts flow of the thermoplastic compound, thereby increasing shear on the thermoplastic compound, to orient the polymer chains and the graphite flakes 904. The thermoplastic compound is preferably injected at a corner of the frame 104 or between the leads 106 and 108. To minimize the amount of stress in the resulting frame, a minimum mold temperature of about 250° F. is preferably maintained during the molding operation.

A moisture barrier film is preferably applied to the exterior surfaces of the frame 104 to further reduce moisture infiltration. Alternatively, the film can be applied to the interior of the frame 104. Acceptable materials include amine-based epoxies available from PPG Industries under the trade name Bairocade, polymer-Al films and polymer-ceramic films.

Seal

Figure 10:
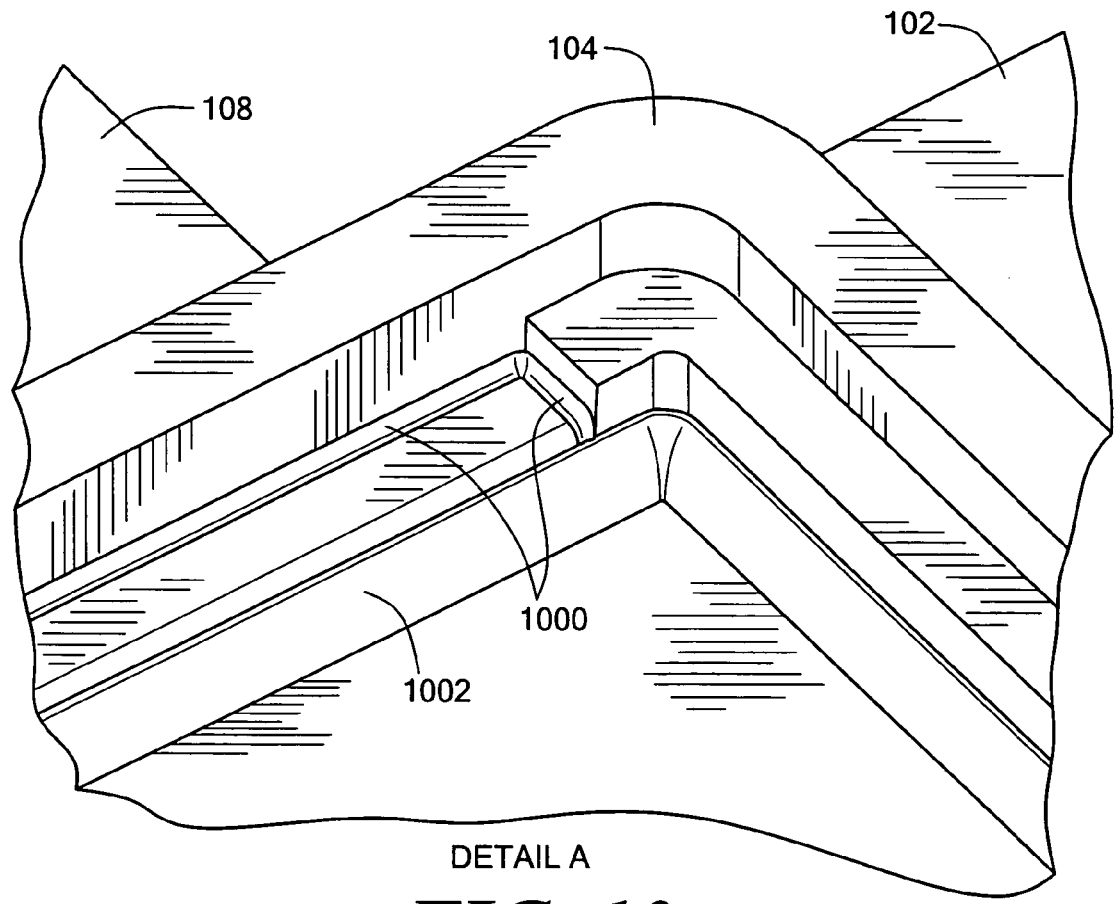
FIG. 10 is an enlarged view of a portion of the circuit package of FIG. 1 showing seals.
Figure 11A:
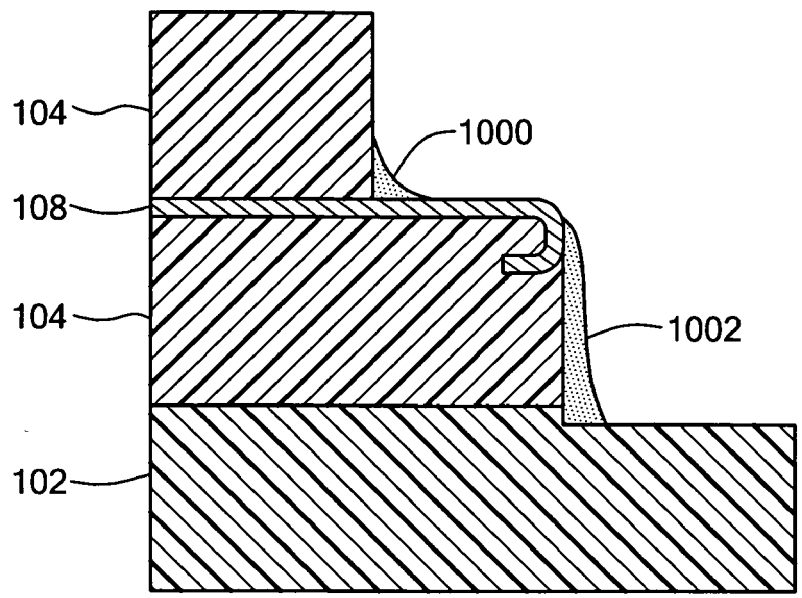
FIGS. 11A and 11B are cross-sectional views of the circuit package of FIG. 1 showing two embodiments of the seals of FIG. 10.
Figure 11B:
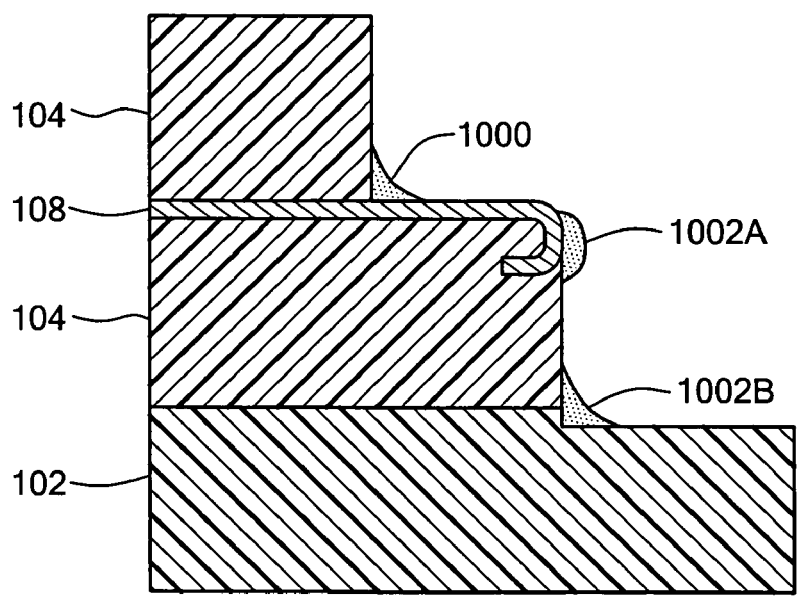

The frame retention feature 500 (FIG. 5A) and the lead retention feature 800 (FIG. 8A) provide good mechanical connections that inhibit infiltration of moisture and atmospheric gases. In addition, the frame 104 preferably includes constituents and an exterior or interior film to reduce this infiltration. To further reduce infiltration, as illustrated in FIG. 10, seals 1000 and 1002 are preferably applied inside the frame 104 along edges of the frame 104, where the frame meets the leads 106 and 108 and where the frame meets the flange 102. As shown in cross-section in FIG. 11A, seal 1002 is effective to prevent infiltration between the flange 102 and the frame 104 and to prevent infiltration between the frame 104 and the lead 108. Alternatively, as shown in FIG. 11B, two seals, 1002A and 1002B can be used instead of the one seal 1002.

To promote good adhesion of the sealant to the frame material, the frame material is preferably cleaned prior to application of the sealant. Plasma cleaning, as is well-known in the art, where oxygen is the predominant medium produces acceptable results. Alternatively, the frame material can be cleaned with solvents or by etching. A 0.008 inch inside-diameter (ID) needle is preferably used to dispense material for seal 1000, and a 0.010 inch ID needle is preferably used to dispense material for seal 1002. Other needle sizes can, of course, be used, depending on the size of the desired bead. To minimize air bubbles in the sealant, a positive displacement, auger pump is used to pump the sealant to the needles.

Figure 12:
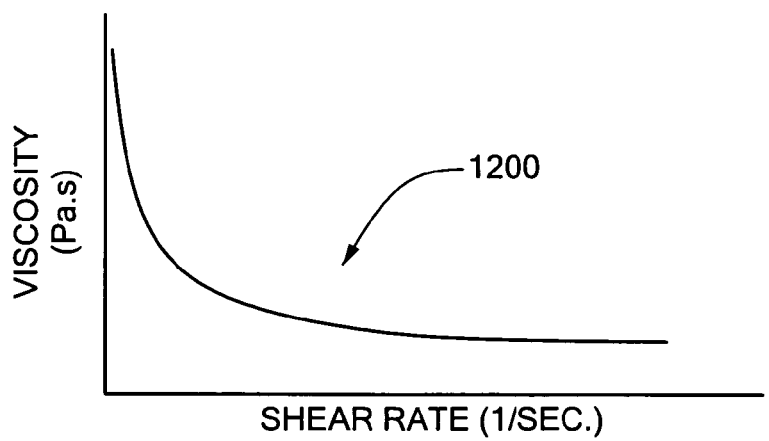
FIG. 12 is a graph showing a relationship between viscosity and shear rate of one embodiment of a material suitable for use as the seal of FIGS. 10, 11A and 11B.

The sealant material preferably has a viscosity between about 58 Pa·s and about 128 Pa·s at a shear rate of about 0.95 per second, and a viscosity between about 12 Pa·s and about 30 Pa·s at a shear rate of about 9.5 per second. FIG. 12 contains a graph 1200 showing a preferred relationship between viscosity and shear rate. A low viscosity is preferred at high shear rates, so the material can be dispensed quickly. However, a high viscosity is preferred at low shear rates, so, once the material has been dispensed, it does not run.

The material preferably has a cason viscosity between about 3 Pa·s and about 7.4 Pa·s. The material's thixotropic index is preferably between about 3.5 and about 4.6.

Suitable materials for the seals 1000 and 1002 include epoxies, silicones and conformal coatings. A suitable sealant includes between about 40% and about 60% solvent (such as 2-butyl acetate) and between about 40% and about 60% epoxy or silicone resin. The epoxy can be, for example, bisphenol A or a cyclic aliphatic epoxide resin. Suitable hardeners include amine hardeners. Alternatively, the seal can be made of Paralyne D or Parylene HT, available from Cookson Electronics.

Lid

Figure 13A:
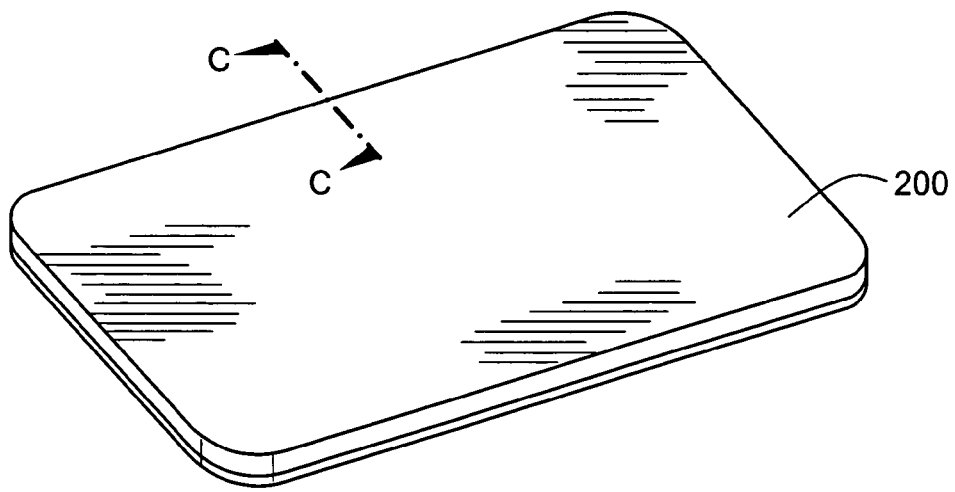
FIG. 13A is a perspective view of a lid for the circuit package of FIG. 1.
Figure 13B:
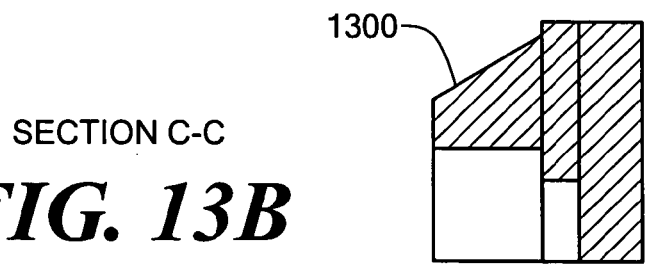
FIG. 13B is a cross-sectional view of a portion of the lid of FIG. 13A, according to one embodiment.

The lid 200 is attached to the frame 104 after the die 110 has been attached to the flange 102 and electrically bonded to the leads 106 and 108. A suitable lid 200 is shown in FIGS. 13A and 13B. The lid 200 is preferably ultrasonically welded to the frame 104, preferably using a welding signal having a frequency between about 50 kHz and about 60 kHz and an amplitude less than about 100 microns (more preferably less than 60 microns). Alternatively, the lid 200 can be laser welded or heat welded to the frame 104.

Conventional ultrasonic plastic welding techniques have not been used to seal lids to circuit packages, because these conventional techniques use lower welding frequencies, which result in higher amplitudes that can damage wirebond assemblies mounted in circuit packages. The higher welding frequencies of the present invention result in lower amplitudes and, consequently, do not damage wirebond assemblies. Conventionally, lids are attached to circuit packages with epoxy adhesives. Advantageously, ultrasonic welding can be accomplished in much less time (approximately 250 msec.) than epoxy cure times (apx. 2 hours).

There is preferably an interference fit between the lid 200 and the frame 104, so portions of both the lid and frame melt and fuse together during the ultrasonic welding. As shown in the cross-section in FIG. 13B, the lid 200 preferably includes a lip 1300 that melts and fuses with the frame 104. The lid 200 is preferably made of the same material as the frame 104, as described above. In addition, a moisture barrier film is preferably applied to the lid 200, as described above with respect to the frame 104.

Manufacturing Details

Figure 14:
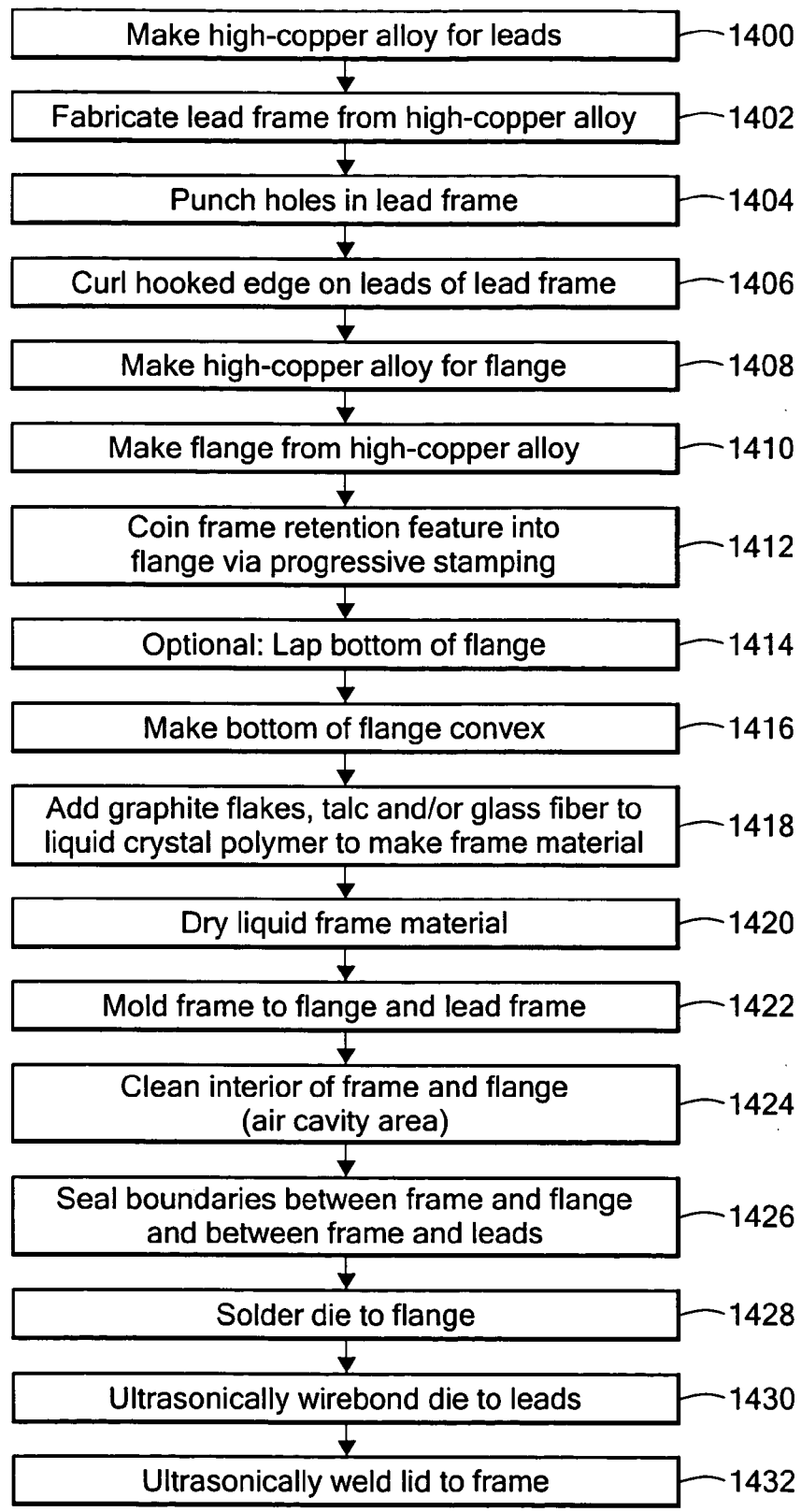
FIG. 14 is a flowchart of a process of making the circuit package of FIG. 1.

Details of the flange 102, frame 104, leads 106 and 108 and lid 200 of the circuit package 100, including materials and processes used to fabricate these parts, have been described in detail above. FIG. 14 contains a simplified flowchart illustrating a process, by which the circuit package 100 can be made and used.

At 1400, a first high-copper alloy is made for the leads 106 and 108. At 1402, lead frames are fabricated from the first high-copper alloy made at 1400. At 1404, holes 310 are punched, etched or otherwise made in lead frame 300 to create one of the lead retention features. At 1406, the ends of the leads 106 and 108 are curled, bent, stamped or etched on the lead frame 300 to create the other lead retention feature 800.

At 1408, a second high-copper alloy is made for the flange 102. At 1410, the flange 102 is fabricated from the second high-copper alloy made at 1408. At 1412, the frame retention feature 500 is coined in the flange 102 by a progressive stamping process. Optionally, at 1414, the bottom of the flange 102 is lapped. At 1416, the bottom of the flange 102 is made convex.

At 1418, graphite flakes, talc and/or glass fiber is added to liquid crystal polymer to make frame material. At 1420, the frame material is dried. At 1422, the frame 104 is molded to the flange 102 and the leads 106 and 108.

At 1424, the interior of the frame 104 and flange 102, i.e. the air cavity area, is cleaned. At 1426, the sealant is applied to seal the boundaries between the frame 104 and the flange 102 and between the frame and the leads 106 and 108.

At 1428, the die 110 is attached to the flange 102. At 1430, the die 110 is ultrasonically wirebonded to the leads 106 and 108. At 1432, the lid 200 is ultrasonically welded to the frame 104.

While the invention has been described with reference to a preferred embodiment, those skilled in the art will understand and appreciate that variations can be made while still remaining within the spirit and scope of the present invention, as described in the appended claims. For example, lower power die can be attached to the flange with epoxy or other adhesives, rather than being soldered thereto. In addition, as is well known in the art, alloys typically contain small amounts of impurities, so constituents described herein do not necessarily total 100%.

Although the frame retention feature 500 and the convexity H of the flange bottom have been described in the context of a high-copper flange 102, these innovations are also applicable to conventional flanges and flanges made of other materials. Although the lead retention features 310, 800 and their respective alternatives have been described in the context of high-copper leads, these innovations are also applicable to conventional leads and leads made of other materials. Although the frame material has been described in the context of a circuit package 100, this material can be advantageously used in other contexts, such as those that require a material that can withstand high temperatures. Examples of other applications of the frame material include high-temperature laminates in printed circuit boards (PCBs) and sockets for electronic components, cables, PCBs and the like.

What is claimed is:

1. A method for making a moisture impermeable liquid crystal polymer structure, comprising:
   injecting into a mold a composition of matter comprising:
   a liquid crystal polymer; and
   a plurality of graphite inclusions consisting essentially of generally planar graphite flakes;
   wherein the injecting of the composition is performed such that the graphite flakes form tortuous paths and are essentially organized into layers essentially parallel to a surface of said structure.

2. The method of claim 1, wherein the composition of matter comprises between about 10% and about 70% graphite flakes.

3. The method of claim 1, wherein the composition of matter comprises between about 40% and about 50% graphite flakes.

4. The method of claim 1, wherein the structure includes a plurality of surfaces; and the composition is injected such that, after the injecting, the graphite flakes form layers essentially parallel to respective ones of the surfaces.

5. The method of claim 1, wherein the structure is an electronics component package body.

6. The method of claim 1, wherein the concentration of graphite flakes is selected to provide a desired coefficient of thermal expansion (CTE) of the structure.

7. The method of claim 6, wherein the CTE of the structure is approximately 17 ppm/° C.

8. The method of claim 1, wherein the melting point of the LCP is greater than 280° C.

9. The method of claim 8, wherein the melting point of the LCP is greater than 390° C.

10. A method for making a liquid crystal polymer structure comprising the steps of:
    providing a liquid crystal polymer material having a plurality of generally planar graphite flakes; and
    injecting into a mold the liquid crystal polymer material having a plurality of generally planar graphite flakes in a manner to orient the graphite flakes into layers essentially parallel to a surface of the structure and forming tortuous paths through the structure which are effective to inhibit moisture infiltration.

11. The method of claim 10, further comprising pre-drying the liquid crystal polymer material having a plurality of generally planar graphite flakes prior to the step of injecting.

* * * * *